under 35 U.S.C. 154(b) by 92 days.

(12) United States Patent
Lin et al.

(10) Patent No.: US 6,794,893 B2
(45) Date of Patent: Sep. 21, 2004

(54) PAD CIRCUIT AND METHOD FOR AUTOMATICALLY ADJUSTING GAIN FOR THE SAME

(75) Inventors: Kun-Long Lin, Taipei (TW); Meng-Huang Chu, Taipei (TW)

(73) Assignee: Via Technologies, Inc. (TW)

( * ) Notice: Subject to any disclaimer, the term of this patent is extended or adjusted under 35 U.S.C. 154(b) by 92 days.

(21) Appl. No.: 10/349,983

(22) Filed: Jan. 23, 2003

(65) Prior Publication Data

US 2003/0160651 A1 Aug. 28, 2003

(30) Foreign Application Priority Data

Feb. 5, 2002 (TW) .......................................... 91101959 A

(51) Int. Cl.[7] .......................................... H03K 19/177
(52) U.S. Cl. .......................... 326/16; 326/30; 326/21; 326/22; 326/26
(58) Field of Search .............................. 326/16, 21, 22, 326/26, 31–33

(56) References Cited

U.S. PATENT DOCUMENTS 6,166,563 A * 12/2000 Volk et al. ..................... 326/87
6,686,764 B2 * 2/2004 Muff .............................. 326/30

* cited by examiner

Primary Examiner—Anh Q. Tran
(74) Attorney, Agent, or Firm—Madson & Metcalf

(57) ABSTRACT

A pad circuit and operating method for automatically adjusting gains is disclosed, wherein the pad circuit is embedded in an integrated circuit chip that further includes a core logic circuit therein. The pad circuit includes an input/output pin, a gain-adjustable output buffer, an input buffer and a signal feature detector. The method includes the steps as follows. A test signal is firstly issued from the core logic circuit to the gain-adjustable output buffer, while the test signal is then manipulated and outputted to an external device via the input/output pin. Next, a feedback test signal is fed into the input buffer from the external device, while a test result is realized according to a waveform feature of the feedback test signal. Finally, the gain of the gain-adjustable output buffer is adjusted according to the obtained test result.

29 Claims, 5 Drawing Sheets

| Output of rising edge detector | Output of falling edge detector | Driving condition |
|---|---|---|
| 1 | 1 | Bad |
| 1 | 0 | Good |
| 0 | -- | Abnormal |

Fig.4A

| Output of rising edge detector | Output of falling edge detector | Driving condition |
|---|---|---|
| 1 | 1 | Bad |
| 0 | 1 | Good |
| -- | 0 | Abnormal |

Fig.4B

PAD CIRCUIT AND METHOD FOR AUTOMATICALLY ADJUSTING GAIN FOR THE SAME

FIELD OF THE INVENTION

The present invention relates to a pad circuit disposed in an integrated circuit chip and a related operating method, and more particularly to a pad circuit and a related operating method for automatically adjusting the gain of the pad circuit for the integrated circuit chip.

BACKGROUND OF THE INVENTION

An integrated circuit chip is inevitable to process and transmit a number of data signals today. Due to the increase of processing and transmission speeds and the decrease of rated operational voltage, the driving efficiency of a pad circuit becomes more and more significant than before. FIG. 1A is a schematic diagram illustrating the position of a pad circuit 12 in an integrated circuit (IC) chip 1, wherein the pad circuit 12 operates between a core logic circuit 10 and an input/output pin 11 in the IC chip 1. FIG. 1B schematically shows the pad circuit 12 cooperating with the input/output pin 11. When a signal output operation is activated, an output enable (OE) signal enables an output buffer 121 to output a signal from the core logic 10 via the output buffer 121 and the input/output pin 11. On the contrary, when the signal input operation is activated, the OE signal disables the output buffer 121 so as to input a signal to the core logic circuit 10 via the input/output pin 11 and an input buffer 122.

Generally, the output load of the IC chip regarding the input/output pin 11 may vary with the configurations of the hardware devices driven thereby. For example, an integrated drive electronics (IDE) bus may be shared by various number and configurations of hard disk drives or optical disk drives. In order to meet different load requirements resulting from different hardware configurations, the output buffer 121 is manually set up to a proper gain according to the expected load before delivery for assuring of sufficient driving power from the input/output pin 11. However, the preset gain is not adapted to all possible hardware configurations to output perfect driving power any time. The computer system may operate abnormally when the hardware configuration established by the user is beyond the range covered by the preset gain.

Moreover, for an IC chip having many pad circuits, some signal levels on the pad circuits that should be maintained at their current ones may be abnormally switched when a lot of pad circuits simultaneously change their levels. For example, when a signal "00011100" on an 8-bit bus being switched to "00001000", it is obvious that the fifth bit does not need to change its current signal level. However, the neighboring signal lines of the fifth bit (that is, the fourth and the sixth signal lines) must be switched from logic 1 to logic 0, which may affect the fifth bit to be abnormally switched from logic 1 to 0 (i.e., "00000000" will appear on the 8-bit bus) sometimes. Additionally, the statuses of the signal lines, including the trace lengths or the employed materials of the signal lines, or even the connection statuses of the terminal devices (e.g., the pin connection statuses of a hard disk), are varied as environments and applications, which may usually cause unexpected malfunctions to the computer system. Unfortunately, the outside environments regarding bus or connection statuses are difficult to adjust since they are different as applications. Therefore, the purpose of the present invention is to develop a pad circuit with adjustable gain, and a method for automatically adjusting gain for a pad circuit applied in an integrated circuit chip to deal with the above situations encountered in the prior art.

SUMMARY OF THE INVENTION

An object of the present invention is to provide a pad circuit with adjustable gain and a method for automatically adjusting gain for a pad circuit applied in an integrated circuit chip for selecting proper gains in response to various hardware configurations.

According to an aspect of the present invention, there is provided a pad circuit for use in an integrated circuit chip including a core logic circuit. The pad circuit includes an input/output pin, a gain-adjustable output buffer coupled between the core logic circuit and the input/output pin for adjusting the energy of an output signal from the core logic circuit and then outputting the output signal to external devices via the input/output pin. An input buffer of the circuit pad is coupled between the input/output pin and the core logic circuit for receiving an input signal from the external devices via the input/output pin and then outputting the input signal to the core logic circuit. A signal feature detector in the circuit pad is coupled to an output end of the input buffer and the gain-adjustable output buffer for receiving a feedback test signal from the external device via the input buffer after a test signal is processed by the gain-adjustable output buffer and outputted to the external devices via the input/output pin. The signal feature detector still realizes a test result in response to a waveform feature of the feedback test signal. The gain-adjustable output buffer adjusts gains according to the test result.

Preferably, the signal feature detector comprises a rising edge detector coupled to the output end of the input buffer for comparing a maximum value of the feedback test signal with a first voltage threshold to obtain a first portion of the test result. A falling edge detector in the signal feature detector is coupled to the output end of the input buffer and the gain-adjustable output buffer for comparing a minimum value of the feedback test signal with a second voltage threshold to obtain a second portion of the test result.

In an embodiment, the rising and falling edge detectors can be implemented by flip-flops.

In an embodiment, the signal feature detector is further coupled to a register, which is coupled to the rising and falling edge detectors, respectively, for storing the test result. Preferably, the pad circuit further includes a discriminating and adjusting device coupled to the register and the gain-adjustable output buffer for adjusting the gain of the gain-adjustable output buffer according to the test result.

Preferably, the pad circuit further includes a reset signal input end coupled to the signal feature detector for receiving a reset signal therefrom to reset the signal feature detector.

Preferably, the pad circuit gain-adjustable output buffer further includes an enable end that couples to the core logic circuit for enabling the gain-adjustable output buffer in response to an enable signal so that the output signal can be transmitted to the external devices via the input/output pin. Preferably, the gain-adjustable output buffer is further coupled to a multiplexer including five input ends and two output ends. These five input ends are used for receiving a test-enable signal, an operation-enable signal, the test signal, an operation signal and a switch signal, respectively. The two output ends are coupled to an input end of the gain-adjustable output buffer and the enable end. The multiplexer is controlled by the switch signal to select one set of signals from the test-enable/test signals and the operation-enable/ operation signals to be the output for feeding into to the gain-adjustable output buffer via the input end and the enable end, respectively.

According to another aspect of the present invention, there is provided a method for automatically adjusting the gain of a pad circuit in an integrated circuit chip. The integrated circuit chip includes a core logic circuit and the pad circuit includes an input/output pin, a gain-adjustable output buffer and an input buffer. The method includes the steps of outputting a test signal from the core logic circuit to the gain-adjustable output buffer for being processed and then outputted to external devices via the input/output pin; receiving a feedback test signal to the input buffer from the external device; realizing a test result according to a waveform feature of the feedback test signal; and adjusting the gain of the gain-adjustable output buffer according to the test result.

Preferably, the test result is realized by the steps as follows. A maximum value of the feedback test signal is firstly compared with a first voltage threshold to obtain a first portion of the test result, which is a first logic value when the maximum value of the feedback test signal is larger than the first voltage threshold, and a second logic value when the maximum value is not larger than the first voltage threshold. Next, a minimum value of the feedback test signal is compared with a second voltage threshold to obtain a second portion of the test result, which is the first logic value when the minimum value of the feedback test signal is smaller than the second voltage threshold, and the second logic value when the minimum value of the fed-back test signal is not smaller than the second voltage threshold.

In an embodiment, the test signal is switched from a low level to a high one under a waveform rising operation in a first time period. In the first time period, a driving condition is determined to be bad when both the first portion and second portion of the test result are indicated to be the first logic value. A driving condition is determined to be good when the first portion and the second portion of the test result are indicated to be the first logic value and the second logic value, respectively. A driving condition is determined to be abnormal when the first portion of the test result is indicated to be the second logic value. Once the driving condition is determined to be bad or abnormal, a new gain value is given to the gain-adjustable output buffer for re-adjusting the gain once again.

In another embodiment, the test signal is switched from high to low under a waveform falling operation in a second time period, wherein a driving condition is determined to be bad when both the first and the second portions of the test result are indicated to be to the first logic value. A driving condition is determined to be good when the first portion and the second portion of the test result are indicated to be the first logic value and the second logic value, respectively. A driving condition is determined to be abnormal when the second portion of the test result is indicated to be the second logic value. Once the driving condition is bad or abnormal, a new gain value will be given to the gain-adjustable output buffer for re-performing a further test.

Preferably, the first logic value represents logic 1 and the second logic value represents logic 0.

According to a further aspect of the present invention, there is provided a method for automatically adjusting the gain of a plurality of pad circuits in an integrated circuit chip, wherein the integrated circuit chip includes a core logic circuit. Any one of the pad circuits includes an input/output pin, a gain-adjustable output buffer and an input buffer. The method includes the steps of outputting parallel test signals from the core logic circuit to the gain-adjustable output buffers for being processed and then outputted via the input/output pins; feeding feedback parallel test signals back into the input buffers; realizing a set of test results according to waveform features of the feedback parallel test signals; and adjusting respective gains of the gain-adjustable output buffers according to the set of test results.

Preferably, each of the test results is realized by the steps as follows. Firstly, a maximum value of any feedback parallel test signal is compared with a first voltage threshold to obtain a first portion of the test results, which is a first logic value when the maximum value of the feedback parallel test signal is larger than the first voltage threshold, and a second logic value when the maximum value is not larger than the first voltage threshold. A minimum value of the feedback parallel test signal is then compared with a second voltage threshold to obtain a second portion of the corresponding test result, which is the first logic value when the minimum value of the feedback test signal is smaller than the second voltage threshold, and the second logic value when the minimum value of the feedback test signal is not smaller than the second voltage threshold.

Preferably, a waveform rising operation is performed to rise the signal level of the test signals in a first time period and a falling operation is performed to drop the signal level of the test signals in a second time period. In the first time period, a driving condition of a pad circuit is determined to be bad when both the first portion and second portion of the test results are indicated to be the first logic value, the driving condition of the pad circuit is determined to be good when the first portion and second portion of the test result are respectively the first logic value and the second logic value, and the driving condition of the pad circuit is determined to be abnormal when the first portion of the test result is the second logic value. On the other hand, in the second time period, a driving condition of the pad circuit is determined to be bad when both the first portion and second portion of the test result are the first logic value, the driving condition of the one of the pad circuits is determined to be good when the first portion and second portion of the corresponding test result are respectively the first logic value and the second logic value, and the driving condition of the pad circuit is determined to be abnormal when the first portion of the test result is the second logic value. Preferably, a new gain value for the gain-adjustable output buffer is entered for a further test when the driving condition is bad or abnormal in the first or second time periods.

BRIEF DESCRIPTION OF THE DRAWINGS

The present invention may be understood through the following description with reference to the accompanying drawings, in which:

FIGS. 4A and 4B are tables for determining test results in a first and a second time periods, respectively, according to the present invention.

DETAILED DESCRIPTION OF THE PREFERRED EMBODIMENT

The present invention will now be described more specifically with reference to the following embodiments. Please note that the following descriptions of preferred embodiments of this invention are presented herein for purpose of illustration and description only; it is not intended to be exhaustive or to be limited to the precise form disclosed.

Figure 1A:
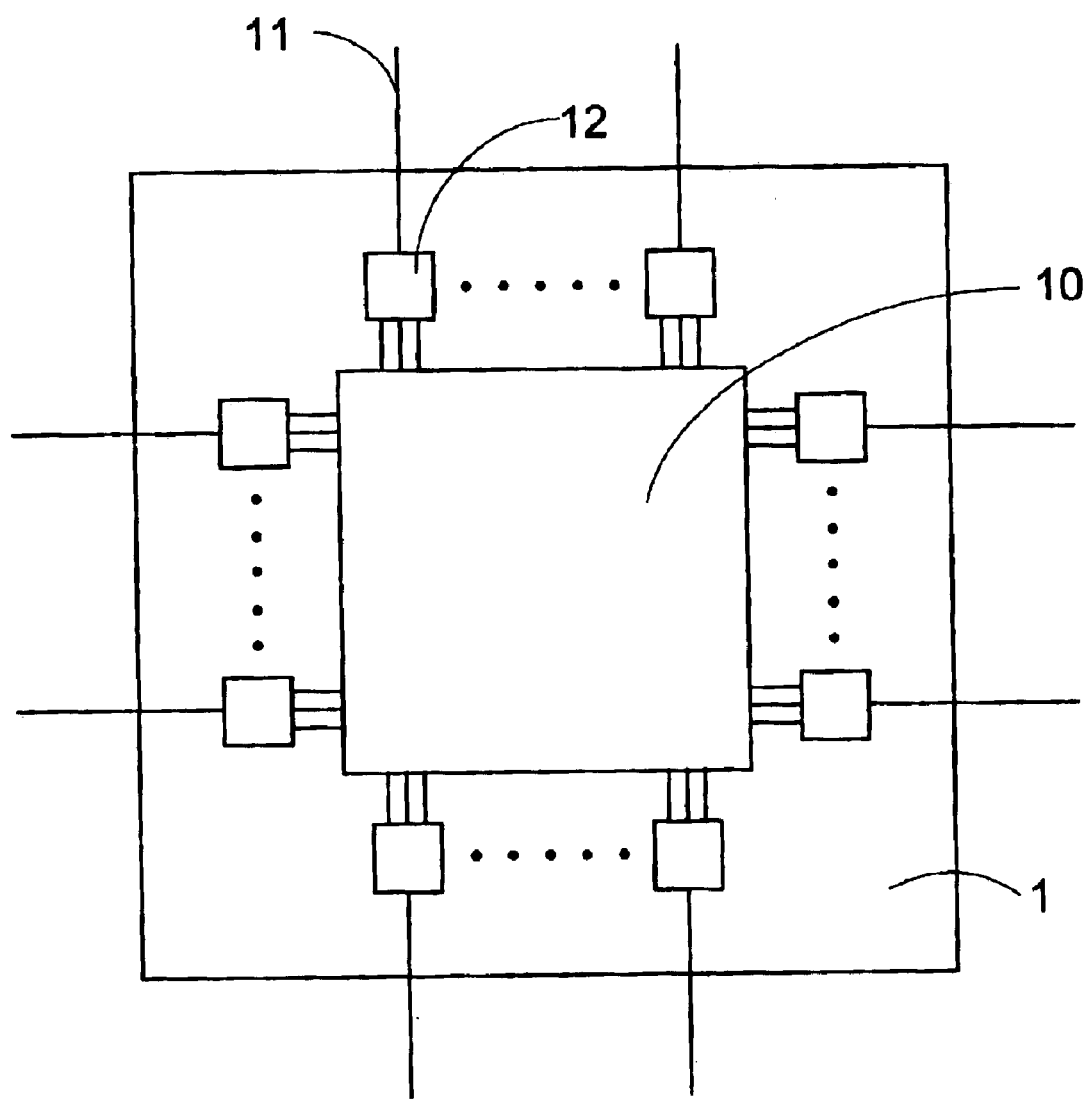
FIG. 1A is a schematic diagram illustrating a typical pad circuit in an integrated circuit chip.
Figure 1B:
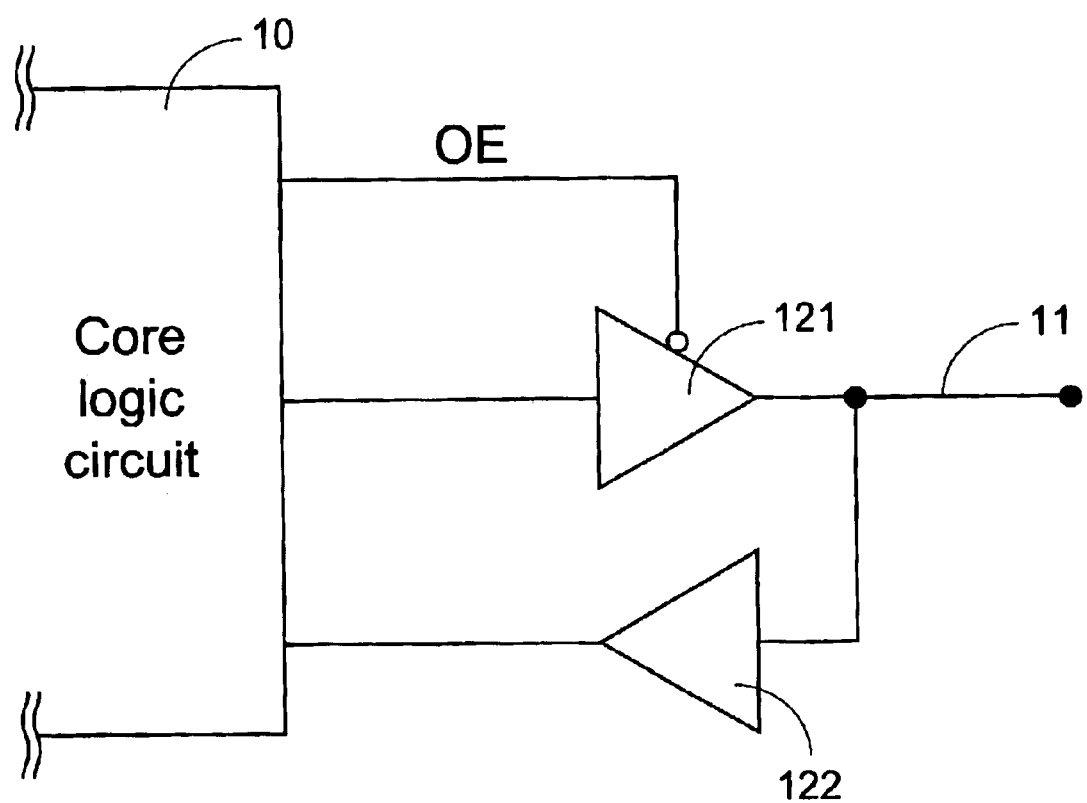
FIG. 1B is a schematic circuit diagram illustrating the pad circuit of FIG. 1A.
Figure 2:
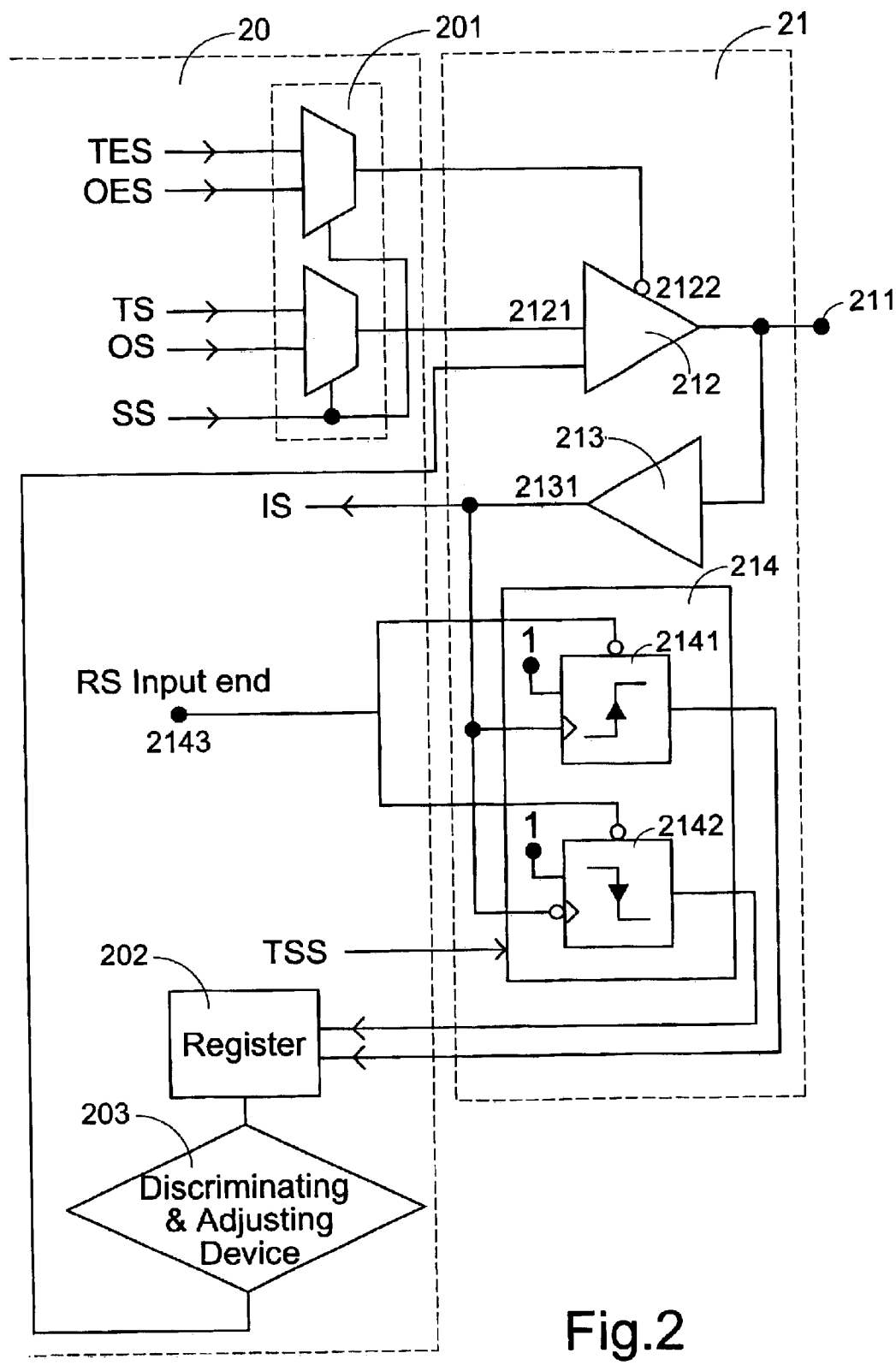
FIG. 2 is a schematic diagram illustrating a preferred embodiment of a pad circuit for use in an integrated circuit chip according to the present invention.

Please refer to FIG. 2 which is a schematic diagram illustrating a preferred embodiment of a pad circuit for use in an integrated circuit chip according to the present invention. The pad circuit 21 is electrically coupled to a core logic circuit 20, and includes an input/output pin 211, a gain-adjustable output buffer 212, an input buffer 213 and a signal feature detector 214. Since the function and structure of the input/output pin 211, the gain-adjustable output buffer 212 and the input buffer 213 are similar to those of the prior art, it is unnecessary to describe them here for the sake of simplicity. For cooperating with the signal feature detector 214 in the embodiment, a multiplexer device 201, a register 202 and a discriminating and adjusting device 203 are additionally arranged in the core logic circuit 20.

The multiplexer device 201 includes five input terminals and two output terminals. The five input terminals are used for receiving a test-enable signal TES, an operation-enable signal OES, a test signal TS, an operation signal OS and a switch signal SS, respectively. These two output terminals are electrically connected to an input terminal 2121 and an enable terminal 2122 of the gain-adjustable output buffer 212, respectively. The multiplexer device 201 switches between a test mode and an operation mode in responsive to the switch signal SS. In other words, under control of the switch signal, the two output terminals of the multiplexer device 201 output the test-enable signal TES and the test signal TS in the test mode, and output the operation-enable signal OES and the operation signal OS under the operation mode. In the operation mode, the operation signal OS is outputted via the output buffer 212 and input/output pin 211. In the test mode, the test signal that is received from the input/output pin 211 for indicating the loads regarding the configuration of the hardware devices will be directed to the signal feature detector 214 via the input buffer 213 for test. The register 202 is used for storing a test result from the signal feature detector 214, while the test result is then provided to the discriminating and adjusting device 203 for determining and adjusting a gain of the gain-adjustable output buffer 212 suitable for the current hardware configuration.

The signal feature detector 214 basically includes a rising edge detector 2141 and a falling edge detector 2142. Both of the rising and falling edge detectors 2141 and 2142 are electrically coupled to an output terminal 2131 of the input buffer 213. A first voltage threshold VT1 and a second voltage threshold VT2 are integrated as a set for the reference of the rising and falling edge detectors, respectively. Each of these threshold values can be adjusted in response to a threshold setting signal TSS according to the characteristics of various transistor devices. For example, the first voltage threshold of a typical transistor-transistor logic (TTL) is preferably set as 2.0V and the second threshold is set as 0.8V. In addition, a reset signal RS input terminal 2143 electrically connected to the signal feature detector 214 is used for directing a reset signal to reset the signal feature detector 214 when necessary.

Figure 3:
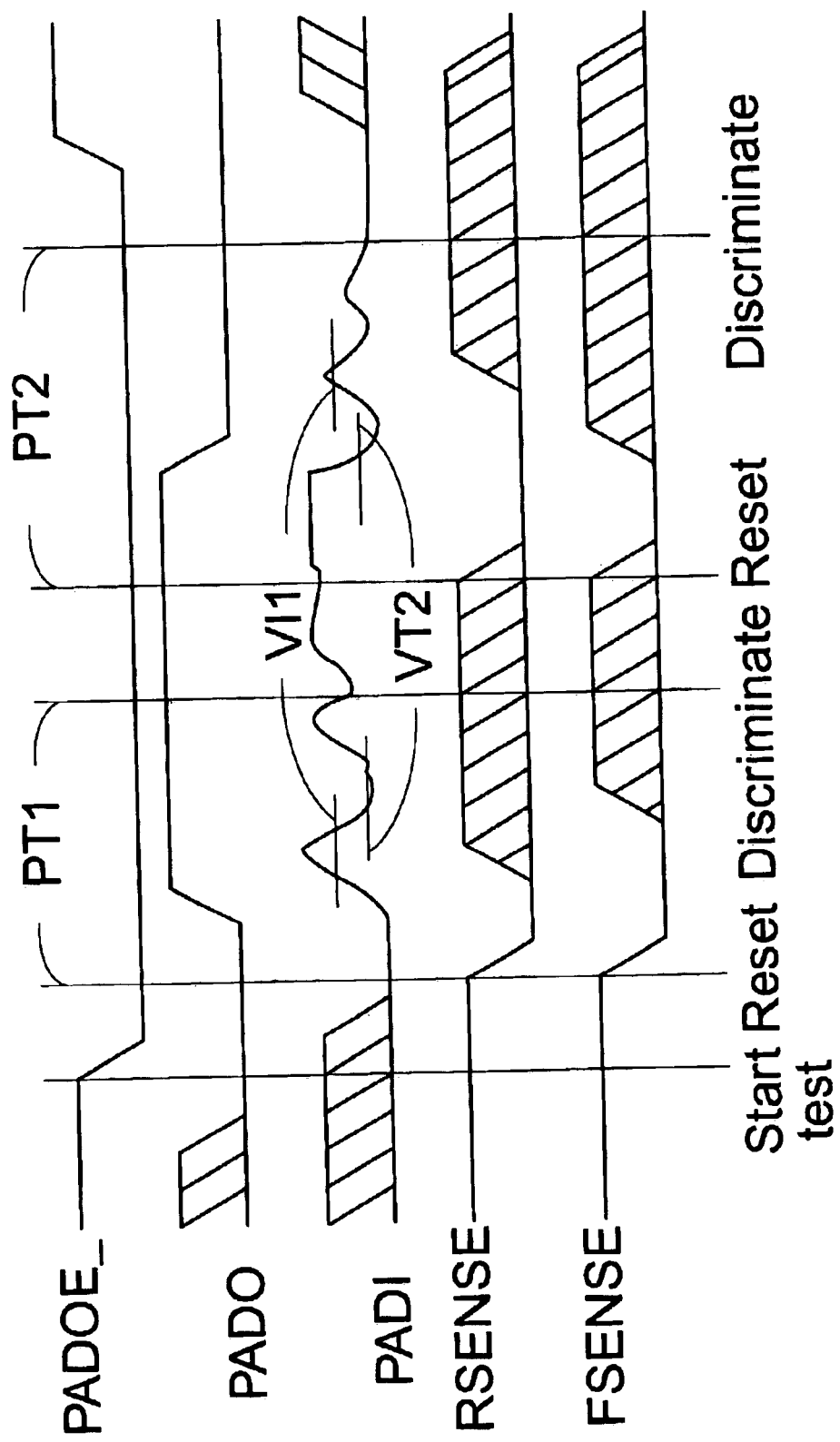
FIG. 3 is a schematic waveform diagram illustrating concerned signals in a test mode according to the present invention.

A schematic waveform diagram of various signals concerned in the test mode is shown in FIG. 3. In the test mode, the gain-adjustable output buffer 212 will be assigned thereto a gain value first, and a test-enable signal (PADOE_ in FIG. 3) is then outputted to enable the gain-adjustable output buffer 212 to manipulate a test signal (PADO in FIG. 3). Finally, the test signal PADO is outputted via the input/output pin 211. At that moment, a feedback test signal relative to the outputted test signal received by the input buffer 213 from the input/output pin 211 is treated as an input signal PADI and provided to the rising and falling edge detectors 2141 and 2142 for a comparison operation.

The comparison operation is described in details hereinafter with reference to the waveform diagram of FIG. 3. First of all, when the test-enable signal PADOE_is switched to a low level, the gain-adjustable output buffer 212 is enabled, while the signal feature detector 214 is reset by the rest signal, and a first time period PT1 starts. In the first time period, the test signal PADO rises from a low level to a high level, while the rising edge detector 2141 compares a maximum value of the input signal PADI with the first voltage threshold VT1 and then outputs a first portion RSENSE of the test result. The input signal PADI inputted via the input/output pin 211 indicates the loads regarding the current configuration of the hardware devices as mentioned above. Subsequently, the falling edge detector 2142 compares a minimum value of the input signal PADI with the second voltage threshold VT2 and then outputs a second portion FSENSE of the test result. In the embodiment, both the rising edge detector 2141 and the falling edge detector 2142 are implemented by flip-flops. The rising edge detector 2141 outputs a logic 1 when the maximum value of the input signal PADI is larger than the first voltage threshold, and a logic 0 when the maximum value of the input signal PADI is not larger than the first voltage threshold. Similarly, the falling edge detector 2142 outputs a logic 1 when the minimum value of the input signal PADI is smaller than the second voltage threshold, and a logic 0 when the minimum value of the input signal PADI is not smaller than the second voltage threshold. Next, the signal feature detector 214 is reset by the reset signal again, and a second time period PT2 starts. In the second time period, the test signal PADO falls from the high level to the low one. The falling edge detector 2142 compares a minimum value of the input signal PADI with the second voltage threshold VT2 and then outputs a second portion FSENSE of a test result while the rising edge detector 2141 compares a maximum value of the input signal PADI with the first voltage threshold VT1 and then outputs a first portion RSENSE of the test result. Likewise, the rising edge detector 2141 outputs a logic 1 when the maximum value of the input signal PADI is larger than the first voltage threshold, and a logic 0 when the maximum value of the input signal PADI is not larger than the first voltage threshold. The falling edge detector 2142 outputs a logic 1 when the minimum value of the input signal PADI is smaller than the second voltage threshold, and a logic 0 when the minimum value of the input signal PADI is not smaller than the second voltage threshold. The test results, which are 2-bit digital data in the embodiment, are stored in the register 202, and then provided to the discriminating and adjusting device 203 to discriminate the driving condition under the selected gain according to the tables as shown in FIGS. 4A and 4B. Based on the test result, the gain of the gain-adjustable output buffer 212 is properly adjusted to result in a satisfactory driving condition.

FIGS. 4A and 4B are tables regarding the test results mentioned above with the driving condition in the first and second time periods, respectively, according to the present invention. Referring to the table of FIG. 4A, when both the rising edge detector 2141 and the falling edge detector 2142 output the logic 1, the discriminating and adjusting device 203 will determine the driving condition as a bad one. On the other hand, the driving condition is determined to be good by the discriminating and adjusting device 203 when the outputs of the rising edge detector 2141 and the falling edge detector 2142 are logic 1 and logic 0, respectively. In addition, when the outputs of the rising edge detector 2141 is logic 0, no matter what the output of the falling edge detector 2142 is, (i.e., the logic 1 or 0) the driving condition will be determined to be function fail, resulting in an abnormal operation. Now referring to FIG. 4B, in the second time period, when both the outputs of the rising edge detector 2141 and the falling edge detector 2142 are the logic 1, the driving condition is determined to be bad by the discriminating and adjusting device 203. The driving condition is determined to be good when the outputs of the rising edge detector 2141 and the falling edge detector 2142 are the logic 0 and the logic 1, respectively. Once the output of the falling edge detector 2142 is logic 0, the driving condition is determined to be function fail no matter what the output of the rising edge detector 2141 is, i.e., either the logic 1 or 0. Under this circumstance, the IC chip functions normally.

The above test procedure can be performed in a time period before the system and other devices drive the bus connected to the input/output pin 211. For example, it can be accomplished when the system is just started, or by actively issuing a bus busy signal to the system and other devices. After proceeding the tests in the first and the second time periods, the discriminating and adjusting device 203 determines whether the initial gain value of the gain-adjustable output buffer 212 is proper or not according to the test results obtained from the first and the second time periods. If it is not, that is the driving condition is determined to be bad or abnormal, a new gain for the gain-adjustable output buffer 212 is automatically entered to re-start a further test procedure until a specific gain value adapted to the hardware device configuration is obtained.

On the other hand, a data bus is generally connected to a plurality of pad circuits of a single chip at the same time. When the pad circuits are simultaneously level-switched, the probability that abnormal phenomenon occurs increases. In addition, the external environments of the input/output pin, such as the material or length of the signal trace, the connection status with the terminal devices, also affect the switch condition of the signal trace. For efficiently solving the above problems, all the plural pad circuits connected to the data bus are preferably designed according to the present invention. Practically, parallel signals with different switching conditions are designed to be the test signals when many pad circuits are used to perform the test procedure simultaneously. For example, all bits of an 8-bit bus signal may be switched into their reverse phases, e.g. from "00000000" into "11111111" or from "11111111" into "00000000", etc, according to the practical needs. Meanwhile, the pad circuits perform the test procedure mentioned in the above embodiment in response to respective bits of test signals. When any of the pad circuits is in a bad or abnormal driving condition, the output gain of such pad circuit can be individually adjusted according to the present invention. Thus, all the signal traces proceeding signal level switching operations will not be affected by the adjacent switching signal traces. The error possibility is eliminated, and the gains for different pad circuits can be automatically and independently adjusted to meet various signal trace conditions.

The discriminating and adjusting device 203 can be implemented by using combinational circuits or programs stored in a memory. The pad circuit scheme and the test operation above-mentioned can be widely applied to various signal transmission interfaces, such as an integrated driving electronics (IDE) bus, a small computer system interface (SCSI) and a universal serial bus (USB). Moreover, the test operation can even support a hot plugging operation. One thing has to do when the hardware configuration is changed is to actively output a busy signal to the system and other devices so as to inhibit other devices from activating any access operation via the transmission interface. Then, the test operation can be performed in this break for automatically adjusting a gain value for the output buffer.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pad circuit for use in an integrated circuit chip including a core logic circuit, comprising:

a gain-adjustable output buffer coupled between said core logic circuit and an input/output pin for amplifying an energy of an output signal from said core logic circuit and then outputting said output signal to an external device via said input/output pin;

an input buffer coupled between said input/output pin and said core logic circuit for receiving an input signal from said external device via said input/output pin and then outputting said input signal to said core logic circuit; and a signal feature detector coupled to an output end of said input buffer and said gain-adjustable output buffer, receiving a feedback test signal from said external device via said input buffer after a test signal being manipulated by said gain-adjustable output buffer and outputted to said external device via said input/output pin, and realizing a test result in response to a waveform feature of said feedback test signal, said gain-adjustable output buffer adjusting gain according to said test result.

2. The pad circuit according to claim 1 wherein said signal feature detector comprises:

a rising edge detector coupled to said output end of said input buffer for comparing a maximum value of said test signal feedback with a first voltage threshold to obtain a first portion of said test result; and a falling edge detector coupled to said output endof said input buffer and said gain-adjustable output buffer for comparing a minimum value of said test signal feedback with a second voltage threshold to obtain a second portion of said test result.

3. The pad circuit according to claim 2 wherein said rising edge detector comprises a flip-flop and said falling edge detector comprises a flip-flop.

4. The pad circuit according to claim 2 wherein said signal feature detector is coupled to a register, and said register is coupled to said rising edge detector and said falling edge detector for storing said test result.

5. The pad circuit according to claim 4 further comprising a discriminating and adjusting device coupled to said register and said gain-adjustable output buffer for adjusting gain of said gain-adjustable output buffer according to said test result.

6. The pad circuit according to claim 1 further comprising a reset signal input end coupled to said signal feature detector for receiving a reset signal therefrom to reset said signal feature detector.

7. The pad circuit according to claim 1 wherein said gain-adjustable output buffer further comprises an enable end coupled to said core logic circuit for enabling said gain-adjustable output buffer in response to an enable signal to allow said output signal to be transmitted to said external device via said input/output pin.

8. The pad circuit according to claim 7 wherein said gain-adjustable output buffer is coupled to a multiplexer including five input ends and two output ends, wherein said five input ends are used for receiving a test-enable signal, an operation-enable signal, said test signal, an operation signal and a switch signal, said two output ends are coupled to an input end of said gain-adjustable output buffer and said enable end, and said multiplexer is controlled by said switch signal to select one set of signals from said test-enable/test signals and said operation-enable/operation signals to be outputted to said gain-adjustable output buffer via said input end and said enable end.

9. A method for automatically adjusting a gain of a pad circuit in an integrated circuit chip, said integrated circuit chip including a core logic circuit, said pad circuit including an input/output pin, a gain-adjustable output buffer and an input buffer, and said method comprising the steps of:
outputting a test signal from said core logic circuit to said gain-adjustable output buffer;
outputting said processed test signal to an external device via said input/output pin;
feeding a feedback test signal to said input buffer from said external device;
realizing a test result according to a waveform feature of said feedback test signal; and
adjusting a gain of said gain-adjustable output buffer according to said test result.

10. The method according to claim 9 wherein said test result is realized by steps of:
comparing a maximum value of said feedback test signal with a first voltage threshold to obtain a first portion of said test result, wherein said first portion of said test result is indicated to be a first logic value when said maximum value of said feedback test signal is larger than said first voltage threshold, and said first portion of said test result is indicated to be a second logic value when said maximum value is not larger than said first voltage threshold; and
comparing a minimum value of said feedback test signal with a second voltage threshold to obtain a second portion of said test result, wherein said second portion of said test result is indicated to be said first logic value when said minimum value of said feedback test signal is smaller than said second voltage threshold, and said second portion of said test result is indicated to be said second logic value when said minimum value of said feedback test signal is not smaller than said second voltage threshold.

11. The method according to claim 10 wherein a waveform rising operation is performed to said test signal in a first time period, and a driving condition is determined to be bad when both said first portion and said second portion of said test result are indicated to be said first logic value.

12. The method according to claim 11 wherein a new gain value is given for said gain-adjustable output buffer for re-adjusting said gain of said pad circuit when said driving condition is determined to be bad.

13. The method according to claim 10 wherein a waveform rising operation is performed to said test signal in a first time period, and a driving condition is determined to be good when said first portion of said test result is indicated to be said first logic value and said second portion of said test result is indicated to be said second logic value.

14. The method according to claim 10 wherein a waveform rising operation is performed to said test signal in a first time period, and a driving condition is determined to be abnormal when said first portion of said test result is indicated to be said second logic value.

15. The method according to claim 14 wherein a new gain value is given for said gain-adjustable output buffer for re-adjusting said gain of said pad circuit when said driving condition is determined to be abnormal.

16. The method according to claim 10 wherein a waveform falling operation is performed to said test signal in a second time period, and a driving condition is determined to be bad when both said first portion and said second portion of said test result are indicated to be said first logic value.

17. The method according to claim 10 wherein a new gain value is given for said gain-adjustable output buffer for re-adjusting said gain of said pad circuit when said driving condition is determined to be bad.

18. The method according to claim 10 wherein a waveform falling operation is performed to said test signal in a second time period, and a driving condition is determined to be good when said first portion of said test result is indicated to be said first logic value and said second portion of said test result is indicated to be said second logic value.

19. The method according to claim 10 wherein a waveform falling operation is performed to said test signal in a second time period, and a driving condition is determined to be abnormal when said second portion of said test result is indicated to be said second logic value.

20. The method according to claim 10 wherein a new gain value is given for said gain-adjustable output buffer for re-adjusting said gain of said pad circuit when said driving condition is determined to be abnormal.

21. A method for automatically adjusting gains of a plurality of pad circuits in an integrated circuit chip, said integrated circuit chip including a core logic circuit, and each one of said pad circuits including an input/output pin, a gain-adjustable output buffer and an input buffer, said method comprising the steps of:
outputting parallel test signals from said core logic circuit to said gain-adjustable output buffers, wherein said parallel test signals are outputted to an external device via said input/output pins after said parallel test signals being processed by said gain-adjustable output buffers;
feeding feedback parallel test signals issued from said external device to said input buffers;
realizing a set of test results according to waveform features of said feedback parallel test signals; and
adjusting respective gains of said gain-adjustable output buffers according to said set of test results.

22. The method according to claim 21 wherein each one of said parallel test signals is fed into one of said pad circuits.

23. The method according to claim 21 wherein said feedback test signals are generated according to said test signals outputted to said external device.

24. The method according to claim 21 wherein each of said test results is realized by the steps of:
comparing a maximum value of each one of said feedback parallel test signals with a first voltage threshold to obtain a first result, wherein said first result is indicated to be a first logic value when said maximum value is larger than said first voltage threshold, and said first result is indicated to be a second logic value when said maximum value is not larger than said first voltage threshold; and comparing a minimum value of each one of said feedback parallel test signals with a second voltage threshold to obtain a second result, wherein said second result is indicated to be said first logic value when said minimum value is smaller than said second voltage threshold, and said second result is indicated to be said second logic value when said minimum value is not smaller than said second voltage threshold.

25. The method according to claim 24 wherein said first result and said second result are portions of said test results.

26. The method according to claim 21 wherein a waveform rising operation is performed to each one of said test signals in a first time period, and a waveform falling operation is performed to each one of said test signals in a second time period.

27. The method according to claim 24 wherein in said first time period, a driving condition of one of said pad circuits is determined to be bad when both said first result and second result are indicated to be said first logic value, said driving condition of said one of said pad circuits is determined to be good when said first result is indicated to be said first logic value and second result is indicated to be said second logic value, and said driving condition of said one of said pad circuits is determined to be abnormal when said first result is indicated to be said second logic value.

28. The method according to claim 27 wherein a new gain value is given to said gain-adjustable output buffer of said one of said pad circuits, which is determined to be bad or abnormal, such that a further test is performed for gain re-adjusting.

29. The method according to claim 27 wherein in said second time period, a driving condition of one of said pad circuits is determined to be bad when both said first result and second result are indicated to be said first logic value, said driving condition of said one of said pad circuits is determined to be good when said first result is indicated to be said first logic value and second result is indicated to be said second logic value, and said driving condition of said one of said pad circuits is determined to be abnormal when said first result is said second logic value.

* * * * *